(12) United States Patent
Park

(10) Patent No.: US 11,966,553 B2
(45) Date of Patent: Apr. 23, 2024

(54) DISPLAY DEVICE INCLUDING DIGITIZER

(71) Applicant: Samsung Display Co., LTD., Yongin-si (KR)

(72) Inventor: Sang Hyo Park, Suwon-Si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 143 days.

(21) Appl. No.: 17/599,537

(22) PCT Filed: Apr. 23, 2019

(86) PCT No.: PCT/KR2019/004893
§ 371 (c)(1),
(2) Date: Sep. 28, 2021

(87) PCT Pub. No.: WO2020/204247
PCT Pub. Date: Oct. 8, 2020

(65) Prior Publication Data
US 2022/0147170 A1 May 12, 2022

(30) Foreign Application Priority Data

Mar. 29, 2019 (KR) .......................... 10-2019-0037282

(51) Int. Cl.
*G06F 3/046* (2006.01)
*C09J 7/38* (2018.01)
(Continued)

(52) U.S. Cl.
CPC ................ *G06F 3/046* (2013.01); *C09J 7/38* (2018.01); *C09J 2301/204* (2020.08);
(Continued)

(58) Field of Classification Search
CPC .......... G06F 3/046; C09J 7/38; H10K 59/122; H10K 77/111
See application file for complete search history.

(56) References Cited

U.S. PATENT DOCUMENTS

2010/0013785 A1   1/2010  Murai et al.
2016/0266692 A1*  9/2016  Park ..................... B32B 27/281
2019/0014402 A1*  1/2019  Ahn .................... H05K 7/20963

FOREIGN PATENT DOCUMENTS

KR         101371327       3/2014
KR      1020140112800      9/2014
(Continued)

OTHER PUBLICATIONS

International Search Report—PCT/KR2019/004893 dated Dec. 27, 2019, citing references listed within.

*Primary Examiner* — Lisa S Landis
(74) *Attorney, Agent, or Firm* — CANTOR COLBURN LLP

(57) ABSTRACT

A display device includes a display panel, a digitizer disposed on the display panel, and a first coupling layer disposed between the display panel and the digitizer. The digitizer includes a base layer disposed on the display panel and have flexibility, a first circuit pattern disposed on a first surface of the base layer that faces the display panel and extended in a first direction, a second circuit pattern disposed on a second surface of the base layer and extended in a second direction crossing the first direction, and a first insulating layer disposed over the first surface of the base layer to cover the first circuit pattern and including a light-absorbing material.

20 Claims, 18 Drawing Sheets

(51) Int. Cl.
  *H10K 59/122* (2023.01)
  *H10K 77/10* (2023.01)
  *H10K 102/00* (2023.01)

(52) U.S. Cl.
  CPC .................. *C09J 2301/302* (2020.08); *G06F 2203/04102* (2013.01); *G06F 2203/04112* (2013.01); *H10K 59/122* (2023.02); *H10K 77/111* (2023.02); *H10K 2102/311* (2023.02)

(56) References Cited

FOREIGN PATENT DOCUMENTS

| | | |
|---|---|---|
| KR | 101510294 | 4/2015 |
| KR | 1020160109964 | 9/2016 |
| KR | 1020180013328 | 2/2018 |
| KR | 1020180036466 | 4/2018 |
| KR | 1020180095174 | 8/2018 |
| KR | 1020190006113 | 1/2019 |

* cited by examiner

[FIG.1]
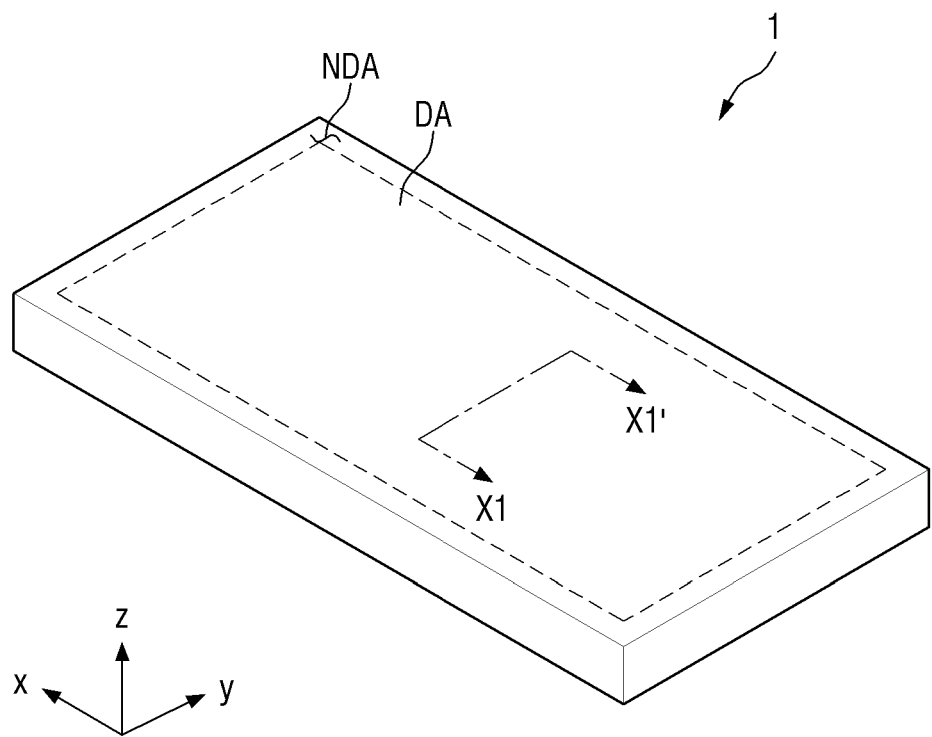

[FIG.2]
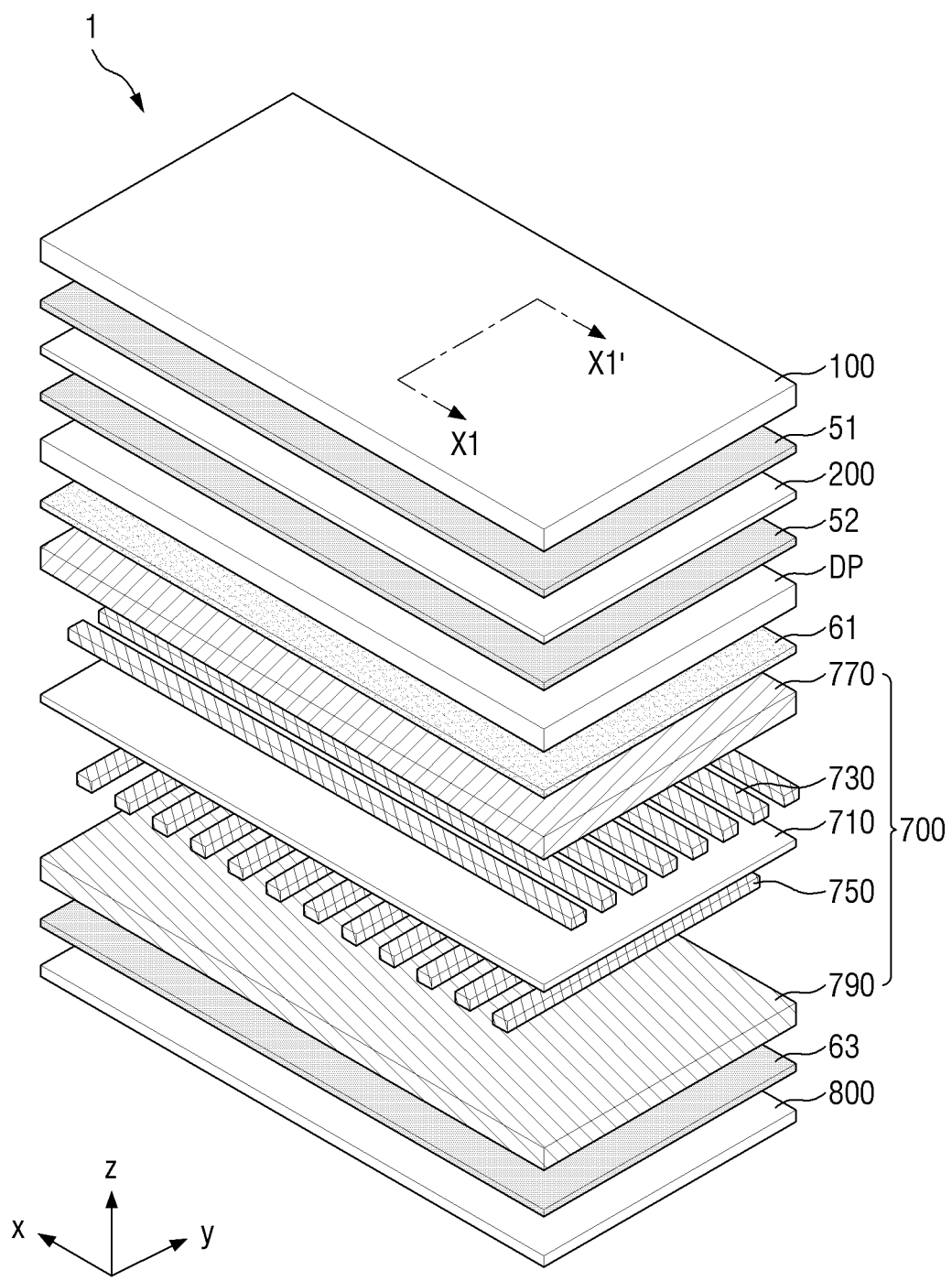

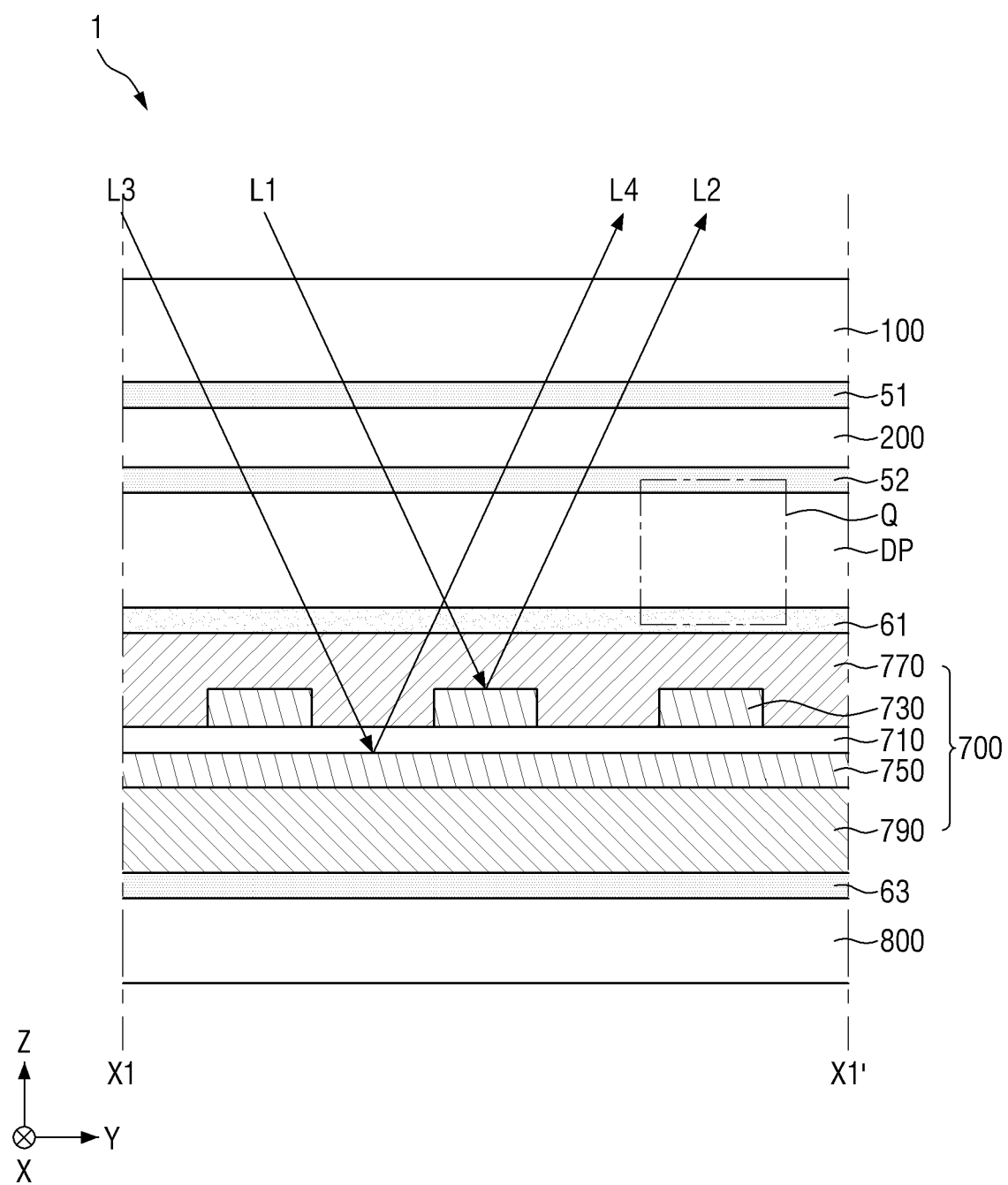
[FIG.3]

[FIG.4]
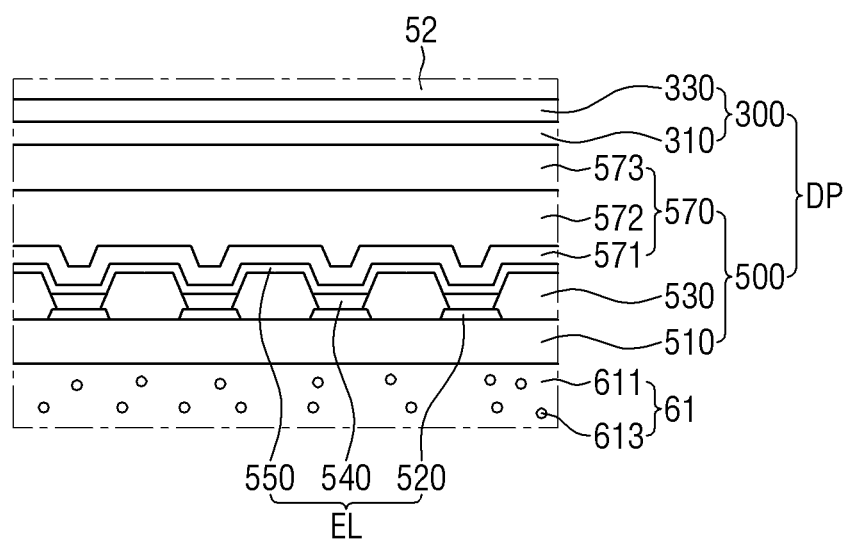

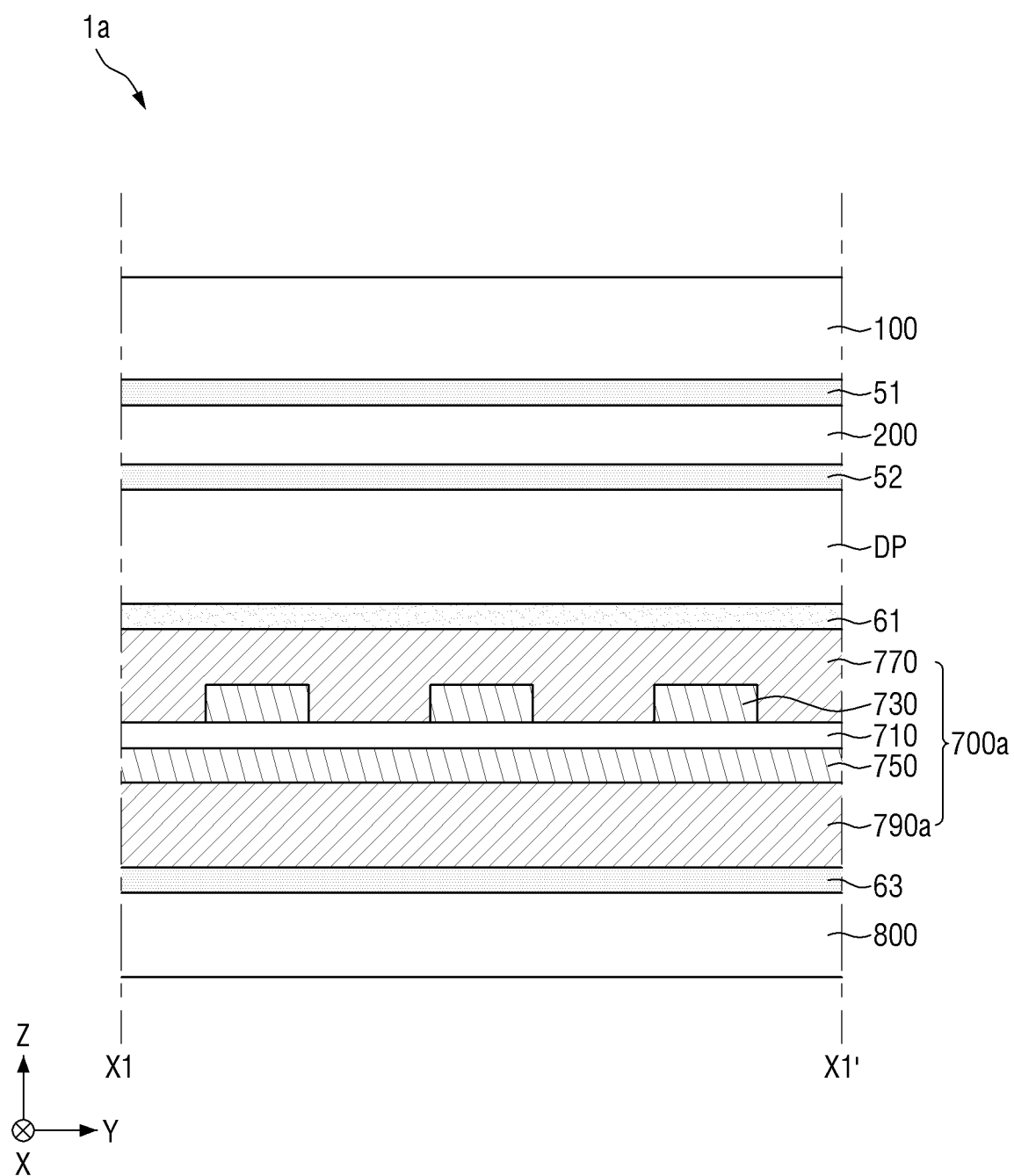
[FIG.5]

[FIG.6]
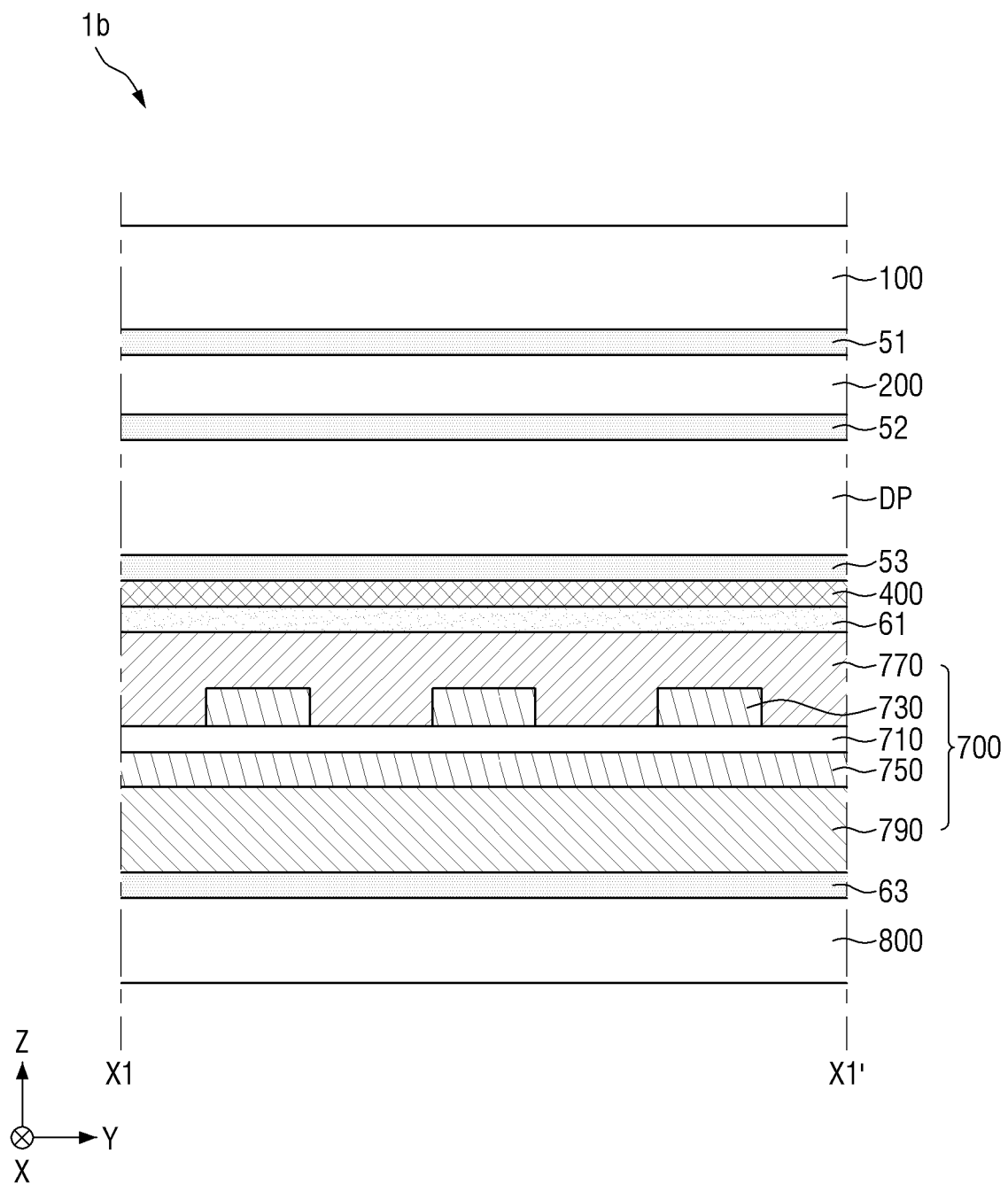

[FIG. 7]
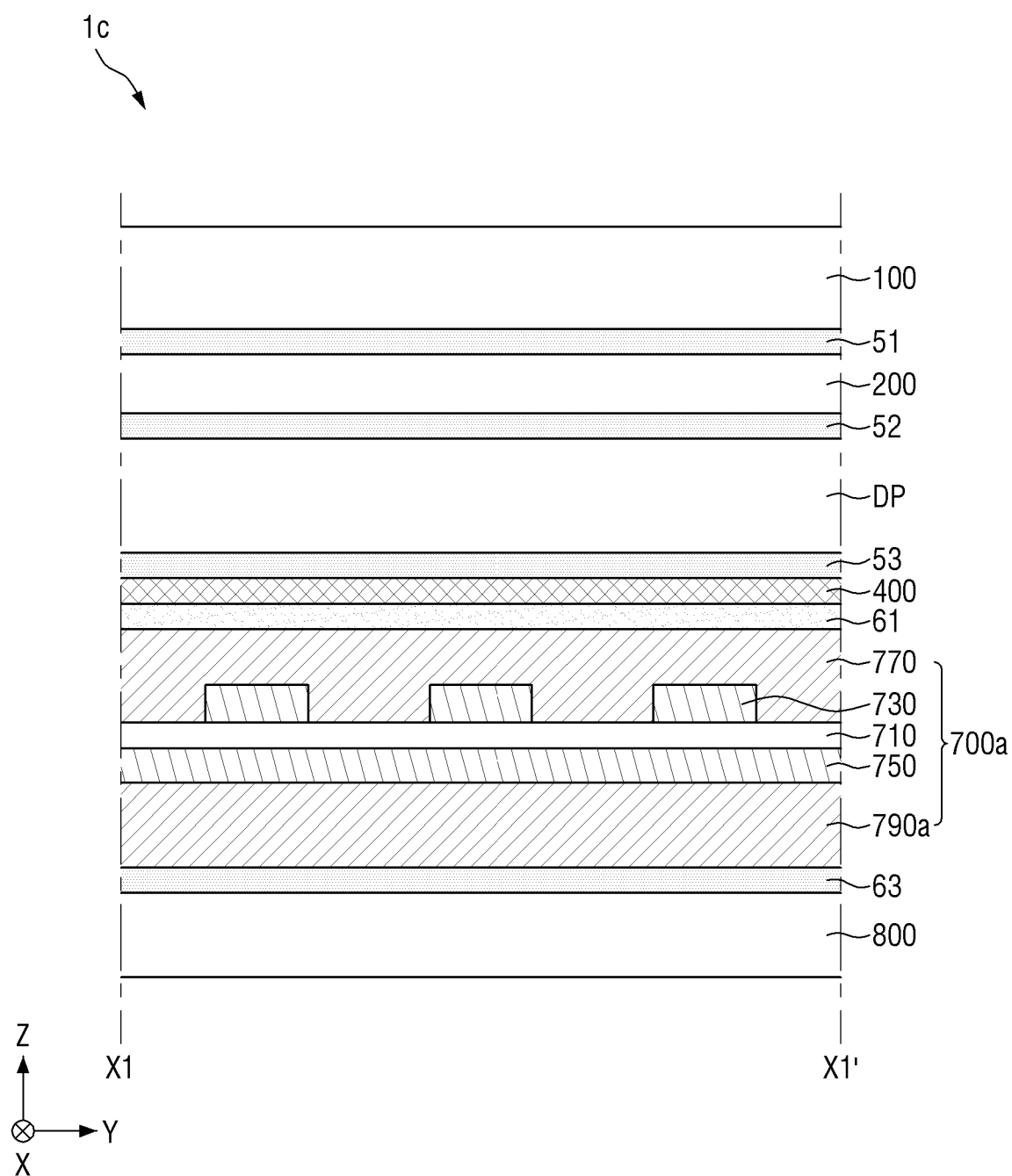

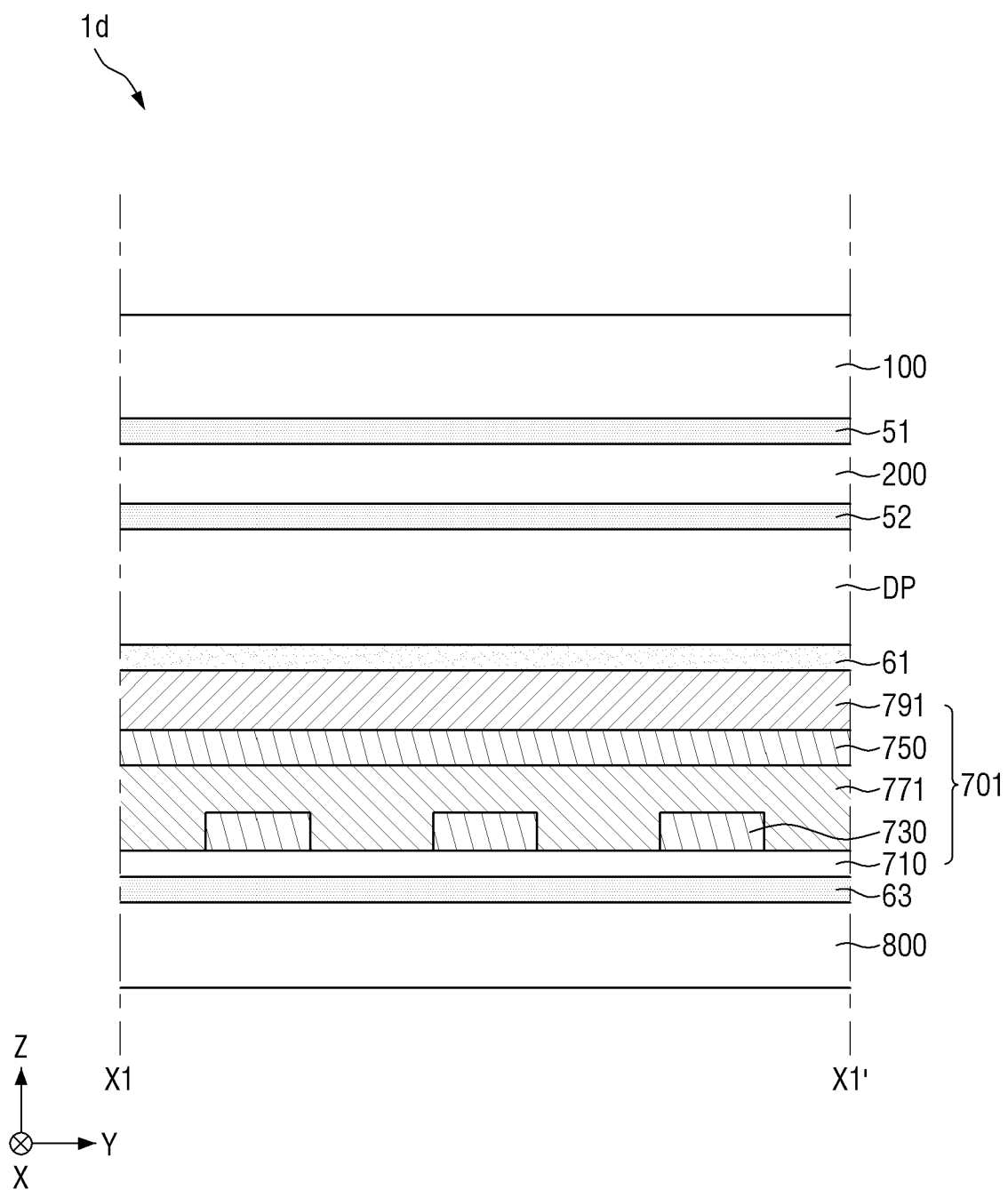
[FIG.8]

[FIG.9]
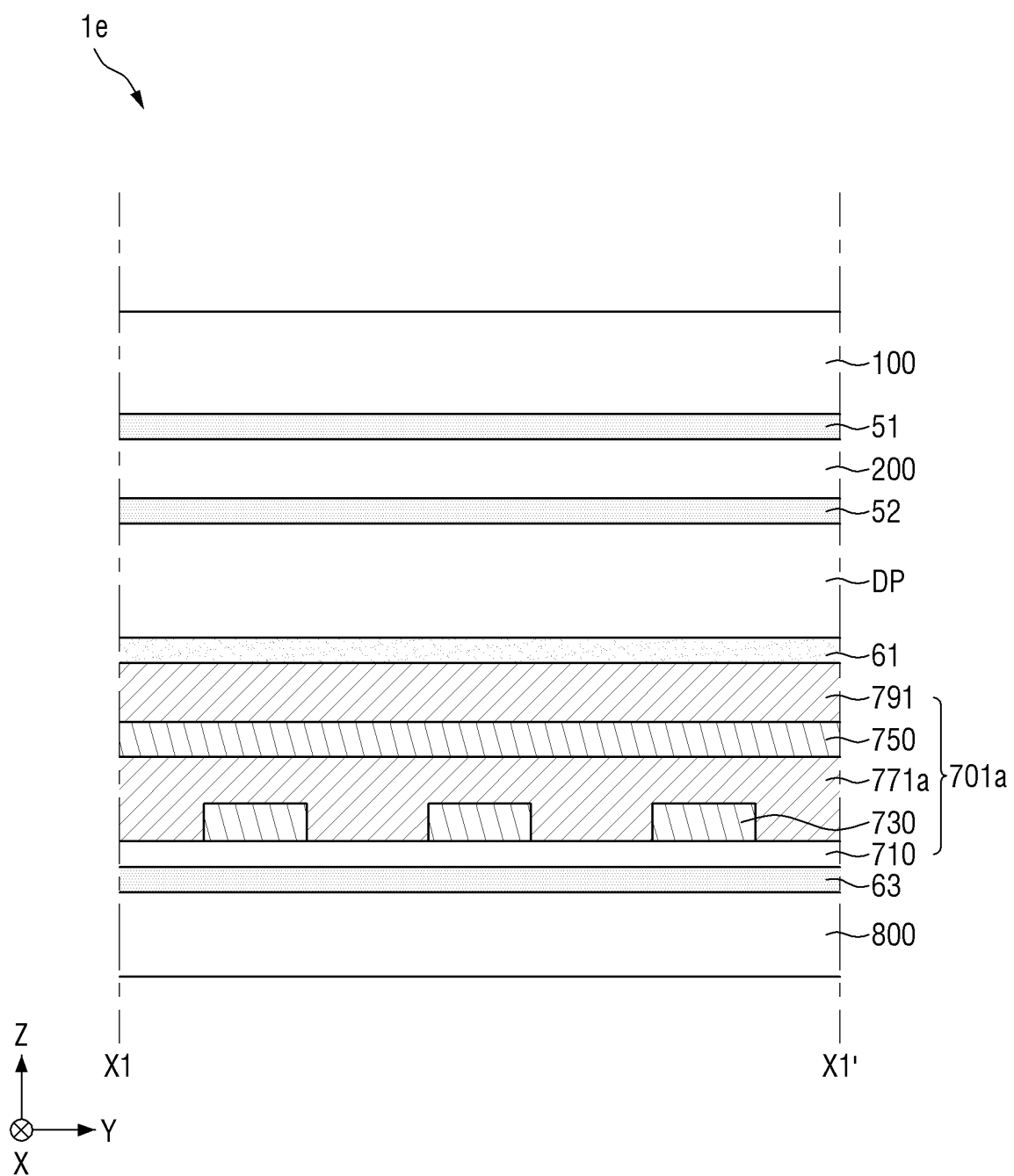

[FIG.10]
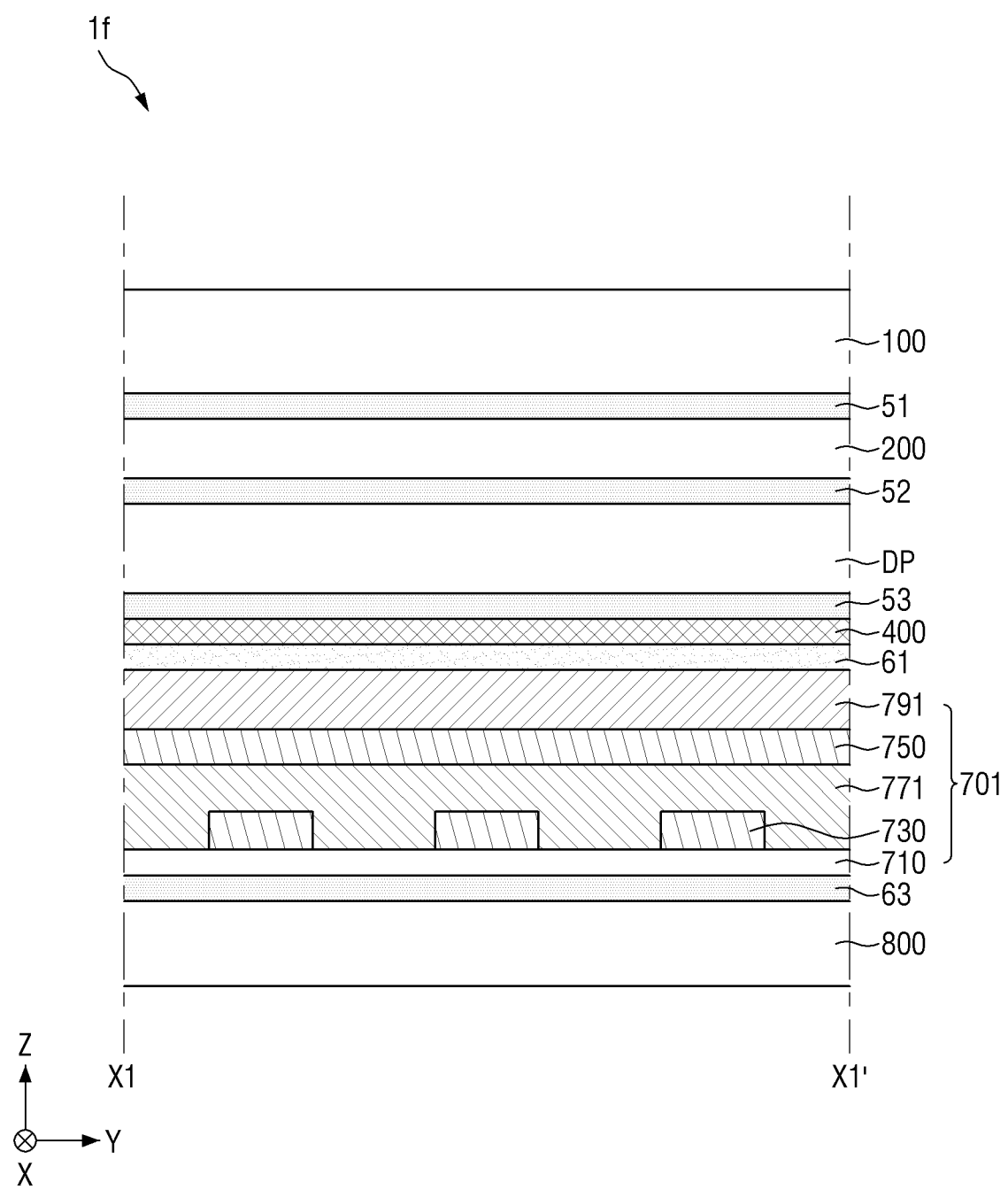

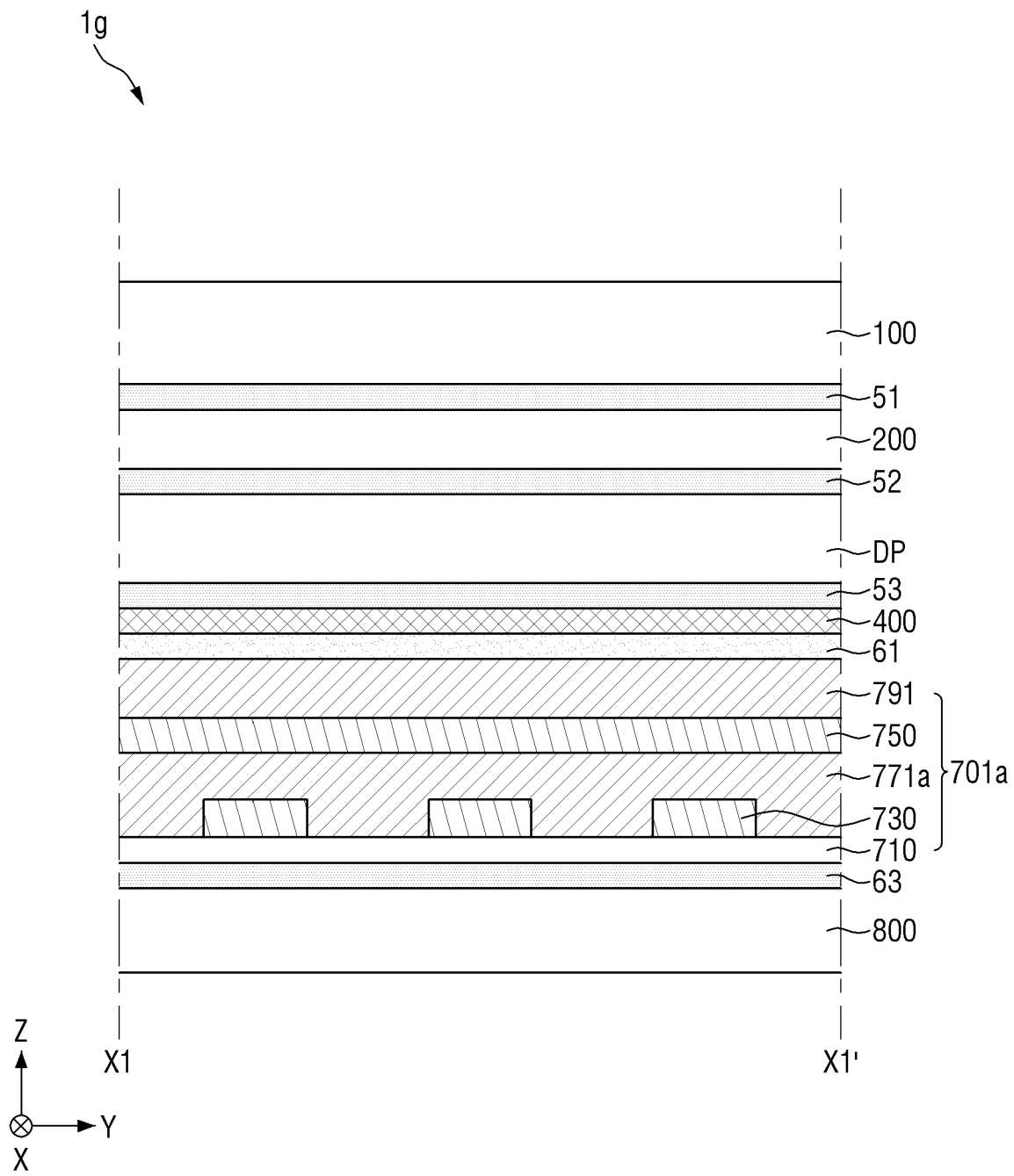
[FIG.11]

[FIG.12]
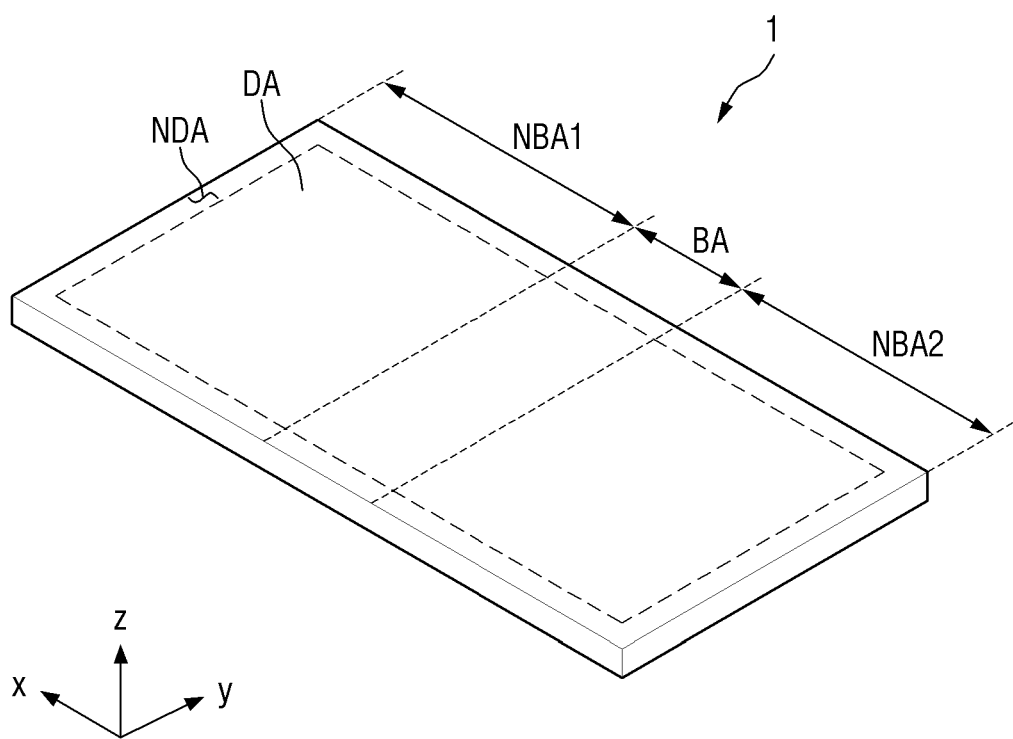

[FIG.13]
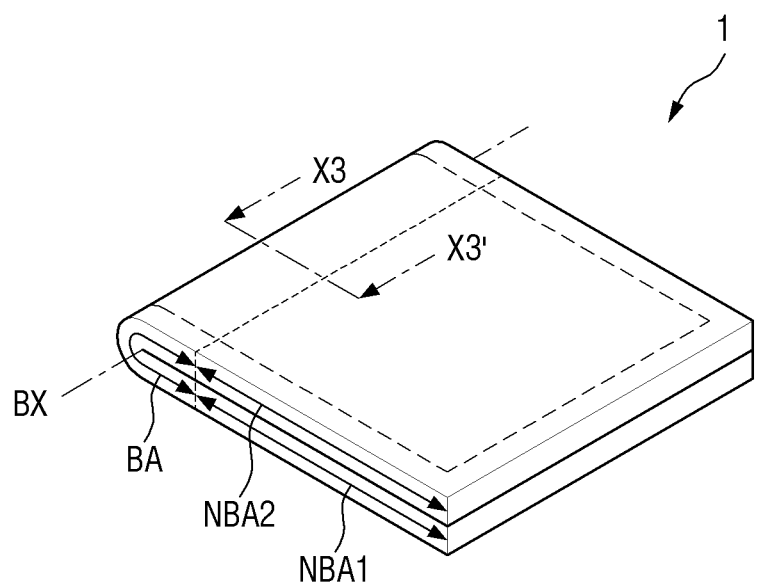

[FIG.14]
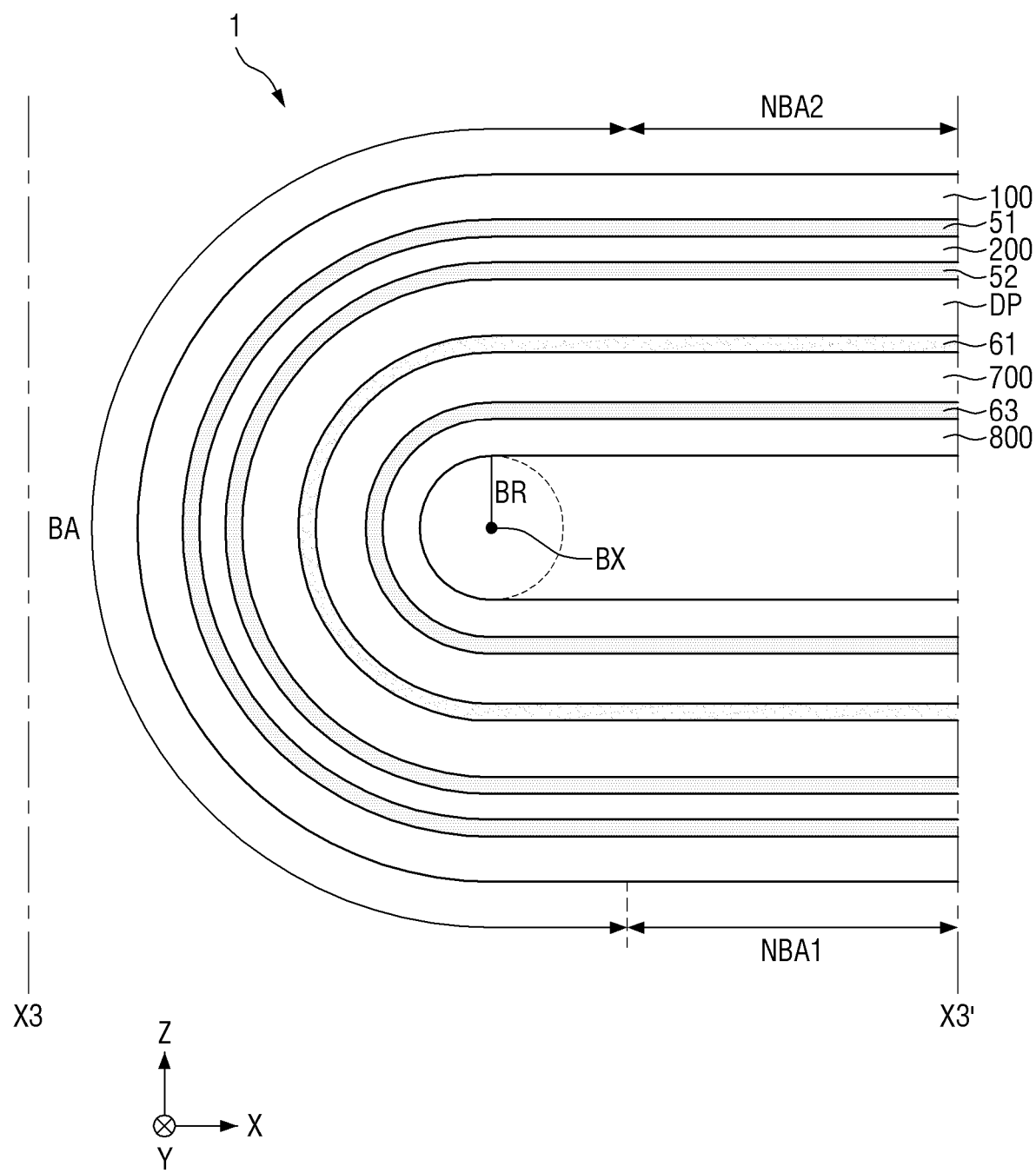

[FIG.15]
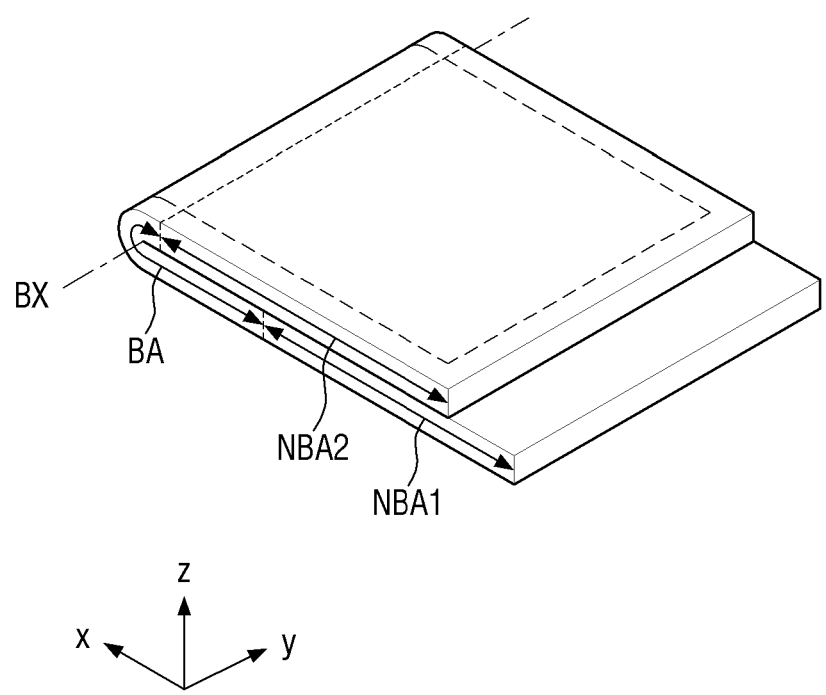

[FIG.16]
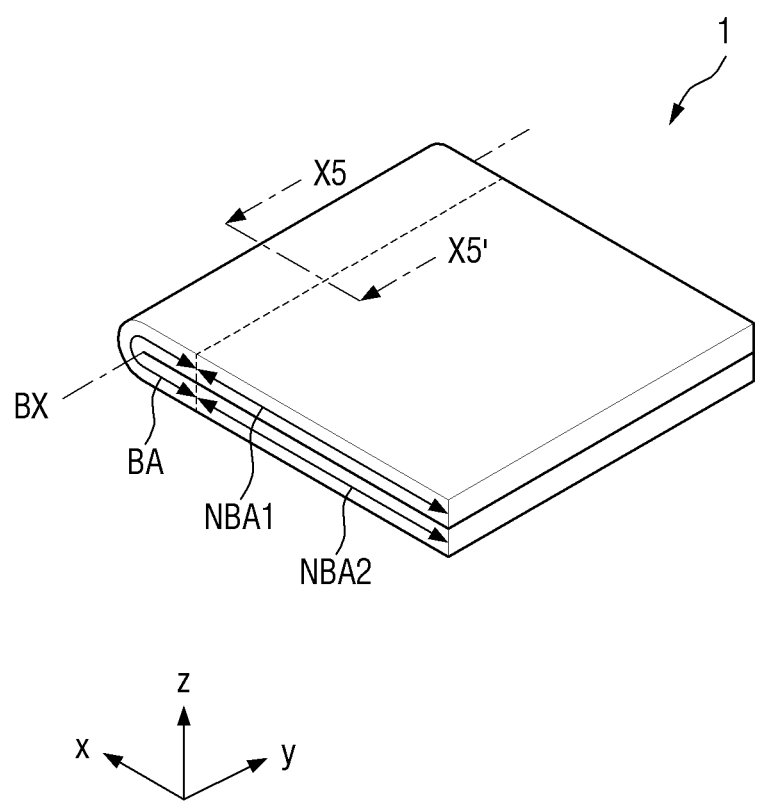

[FIG.17]
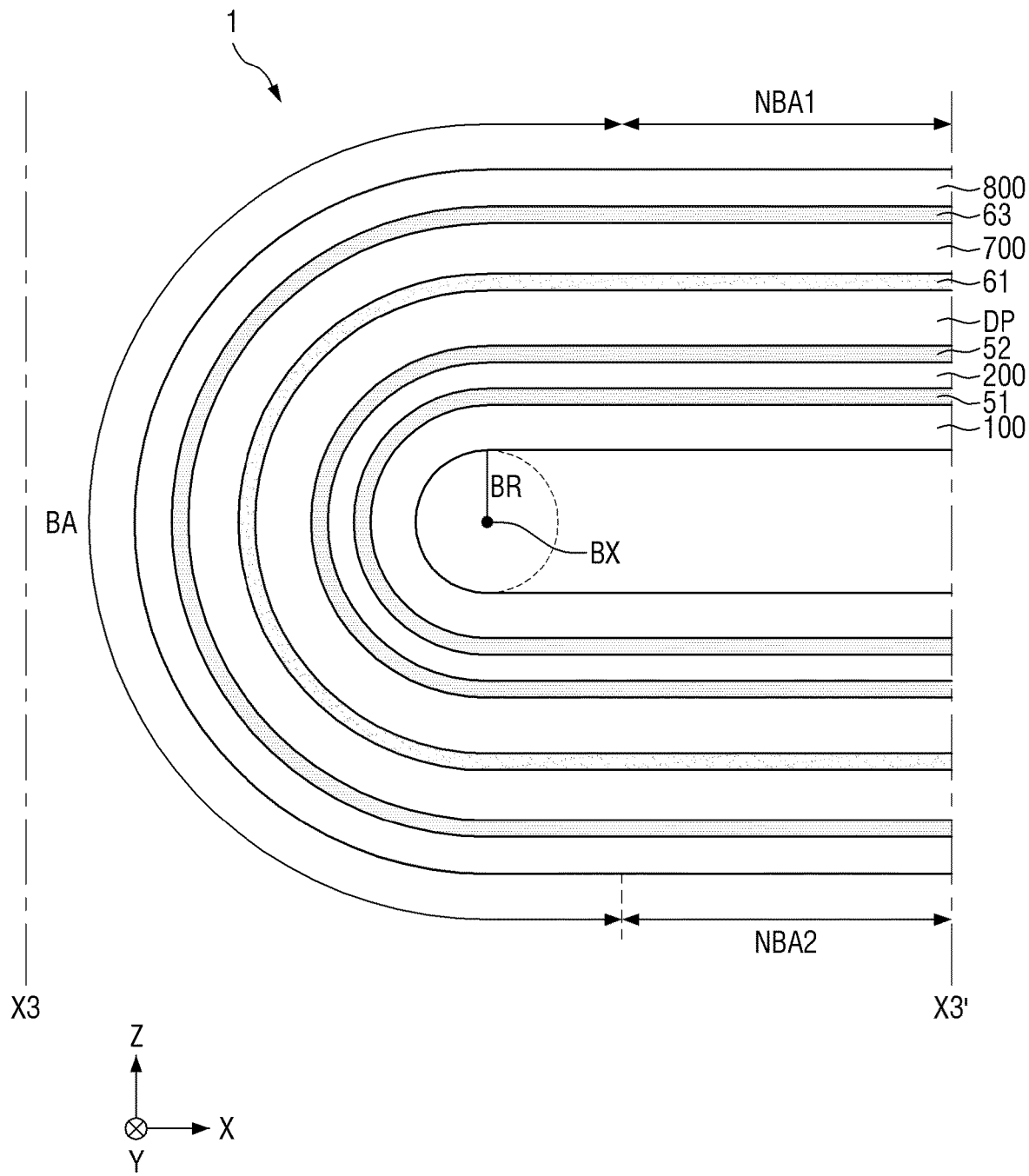

[FIG.18]
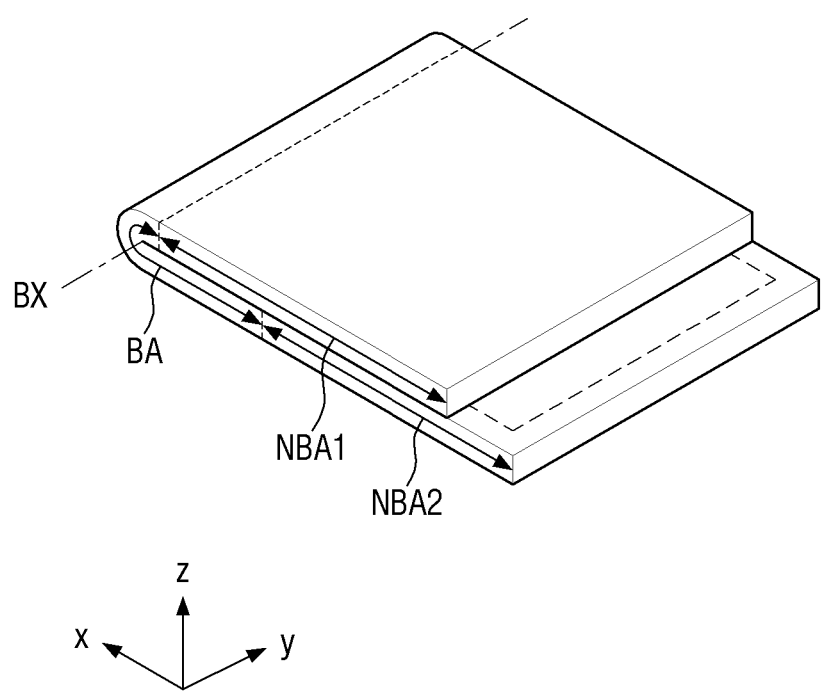

DISPLAY DEVICE INCLUDING DIGITIZER

This application is a national stage application of International Application No. PCT/KR2019/004893 which claims priority to Korean Application No. 10-2019-0037282, filed on Mar. 29, 2019, and all the benefits accruing therefrom under 35 U.S.C. § 119, the content of which in its entirety is herein incorporated by reference.

BACKGROUND

1. Field

Embodiments of the invention relate to a display device.

2. Description of the Related Art

Electronic devices that provide images to a user such as a smart phone, a digital camera, a laptop computer, a navigation device and a smart television ("TV") include a display device for displaying images.

As electronic devices change into a variety of forms, display devices are also changing accordingly. Recently developed electronic devices desire flexible display devices such as a curved display device, a bendable display device, and a rollable display device.

In addition, recent electronic devices support touch input features using an electronic pen (e.g., a stylus) as well as a part of a user's body. Such an electronic pen allows for more precise touch input compared to a touch input using the part of the user's body.

SUMMARY

The touch input using a stylus may utilize electromagnetic resonance. Specifically, a digitizer included in an electronic device senses an electromagnetic force emitted from a stylus to detect a touch input. At least one conductive circuit capable of sensing an external electromagnetic force may be patterned in the digitizer.

Features of the invention provide a display device including a digitizer with improved flexibility.

Features of the invention also provide a display device including a digitizer with improved flexibility, in which patterns of the digitizer are less noticeable.

These and other features, embodiments and advantages of the invention will become immediately apparent to those of ordinary skill in the art upon review of the detailed description and claims to follow.

According to an feature of the invention, there is provided a display device including a display panel, a digitizer disposed on the display panel, and a first coupling layer disposed between the display panel and the digitizer. The digitizer includes a base layer disposed on the display panel and have flexibility, a first circuit pattern disposed on a first surface of the base layer that faces the display panel and extended in a first direction, a second circuit pattern disposed on a second surface of the base layer opposite to the surface of the base layer and extended in a second direction crossing the first direction, and a first insulating layer disposed over the first surface of the base layer to cover the first circuit pattern and including a light-absorbing material.

In some embodiments, the first coupling layer may be in direct contact with the display panel and the first insulating layer.

In some embodiments, the first coupling layer may include an adhesive resin layer and voids dispersed in the adhesive resin layer.

In some embodiments, the first coupling layer may be implemented as a pressure sensitive adhesive, and a shear modulus of the first coupling layer may range from 80 KPa to 150 kilopascals (KPa) at −20 degrees Celsius (° C.).

In some embodiments, the digitizer may further include a second insulating layer that is disposed on the second surface of the base layer to cover the second circuit pattern and includes an organic material.

In some embodiments, the second insulating layer may be a light-absorbing layer.

In some embodiment, the display device may further include a light-absorbing member disposed between the display panel and the first coupling layer, and the first coupling layer may be in direct contact with the light-absorbing member and the first insulating layer.

In some embodiments, the display device may further include a touch sensor disposed on the display panel. The display panel may include a base substrate, a self-luminous element disposed on the base substrate, and an encapsulation layer disposed on the self-luminous element, and wherein the touch sensor comprises a touch element layer disposed on the encapsulation layer, and a protective layer disposed on the touch element layer and including an organic material.

In some embodiments, that display device may further include a buffer member disposed on the digitizer and coupled to the digitizer.

In some embodiment, the display device may further include a second coupling layer disposed between the digitizer and the buffer member, wherein the digitizer further comprises a second insulating layer disposed on the second surface of the base layer to cover the second circuit pattern and including an organic material, and the second coupling layer may be in direct contact with the buffer member and the second insulating layer.

According to another feature of the invention, there is provided a display device including a display panel, a digitizer disposed on the display panel, and a first coupling layer disposed between the display panel and the digitizer. The digitizer includes a base layer disposed on the display panel and having flexibility, a first circuit pattern disposed on a first surface of the base layer that faces the display panel and extended in a first direction, a first insulating layer disposed on the first circuit pattern to cover the first circuit pattern, a second circuit pattern disposed on the first insulating layer and extended in a second direction crossing the first direction, a second insulating layer disposed on the second circuit pattern, and wherein the second insulating layer includes a light-absorbing material.

In some other embodiments, the first coupling layer may be in direct contact with the display panel and the second insulating layer.

In some other embodiments, the first insulating layer and the second insulating layer may include an organic material.

In some embodiments, the first insulating layer may be a light-absorbing layer.

In some other embodiment, the display device may further include a light-absorbing member disposed between the display panel and the first coupling layer, and the first coupling layer may be in direct contact with the light-absorbing member and the second insulating layer.

In some other embodiment, the display device may further include: a buffer member disposed on the digitizer and coupled to the digitizer, and a second coupling layer disposed between the buffer member and the digitizer, wherein the second coupling layer is in direct contact with the base layer and the buffer member.

According to yet another feature of the invention, there is provided a display device including: a window, a functional layer disposed under the window and coupled to the window, a display panel structure disposed under the functional layer and coupled to the functional layer, a digitizer disposed under the display panel structure, and a buffer member disposed under the digitizer and coupled to the digitizer. The digitizer includes a plurality of circuit patterns disposed under the display panel structure, and an insulating layer disposed between the plurality of circuit patterns and the display panel structure and having flexibility, and the insulating layer includes a light-absorbing material.

In some other embodiments, the display panel structure image a display panel including a self-luminous element and having flexibility, and a touch sensor disposed on the display panel and having flexibility.

In some other embodiment, the display device may further include a first coupling layer disposed between the display panel structure and the digitizer, and a shear modulus of the first coupling layer may range from 80 KPa to 150 KPa at −20° C.

In some other embodiment, the display device may further include: a light-absorbing member disposed between the display panel structure and the digitizer, and the light-absorbing member may be coupled to the display panel structure, and the digitizer may be coupled to the light-absorbing member.

The details of embodiments of the subject matter described in this specification are set forth in the accompanying drawings and the description below.

By embodiments of the invention, a display device including a digitizer may have improved flexibility.

In addition, in the embodiments of the invention, a display device including a digitizer may have improved flexibility, in which patterns of the digitizer are less noticeable.

It should be noted that effects of the invention are not limited to those described above and other effects of the invention will be apparent to those skilled in the art from the following descriptions.

BRIEF DESCRIPTION OF DRAWINGS

The above and other exemplary embodiments, advantages and features of this disclosure will become more apparent by describing in further detail exemplary embodiments thereof with reference to the accompanying drawings.

FIG. 1 is a perspective view of an embodiment of a display device according to the invention.

FIG. 2 is an exploded perspective view of the display device shown in FIG. 1.

FIG. 3 is a cross-sectional view of the display device, taken along line X1-X1' of FIGS. 1 and 2.

FIG. 4 is an enlarged view of portion Q of FIG. 3.

FIG. 5 is a cross-sectional view showing a modification of the embodiment shown in FIG. 3.

FIG. 6 is a cross-sectional view of another modification of the embodiment shown in FIG. 3.

FIG. 7 is a cross-sectional view of a modification of the embodiment shown in FIG. 6.

FIG. 8 is a cross-sectional view showing yet another modification of the embodiment shown in FIG. 3.

FIG. 9 is a cross-sectional view showing a modification of the embodiment shown in FIG. 8.

FIG. 10 is a cross-sectional view of another modification of the embodiment shown in FIG. 8.

FIG. 11 is a cross-sectional view of a modification of the embodiment shown in FIG. 10.

FIG. 12 is a perspective view showing an embodiment of a display device in a normal state according to the invention.

FIG. 13 is a perspective view showing the embodiment of the display device in an out-folding state according to the invention.

FIG. 14 is a cross-sectional view of the display device, taken along line X3-X3' of FIG. 13.

FIG. 15 is a perspective view showing an embodiment of the display device in an out-folding state with a part of the display device sliding according to the invention.

FIG. 16 is a perspective view showing an embodiment of the display device in an in-folding state according to the invention.

FIG. 17 is a cross-sectional view of the display device, taken along line X5-X5' of FIG. 16.

FIG. 18 is a perspective view showing an embodiment of the display device when a part of the display device slides in the in-folding state according to the invention.

DETAILED DESCRIPTION

Advantages and features of the invention and methods to achieve them will become apparent from the descriptions of embodiments hereinbelow with reference to the accompanying drawings. However, the invention may be modified in many different ways and it should not be considered to be limited to the embodiments set forth herein. The invention is defined solely by the appended claims.

It will be understood that when an element or layer is referred to as being "on" another element or layer, the element or layer can be directly on another element or layer or intervening elements or layers may also be present. In contrast, when an element is referred to as being "directly on" another element, there is no intervening element present.

Although terms such as first, second, etc. are used to distinguish arbitrarily between the elements such terms describe, and thus these terms are not necessarily intended to indicate temporal or other prioritization of such elements. These terms are used to merely distinguish one element from another. Accordingly, as used herein, a first element may be a second element within the technical scope of the invention.

As used herein, the singular forms are intended to include plural forms as well, unless the context clearly indicates otherwise. The terms "comprising," "including," and "having" are intended to be inclusive and mean that there may be additional elements other than the listed elements, unless the context clearly indicates otherwise.

As used herein, unless stated otherwise, the terms "on," "upper side," "above," "top" and "upper surface" refer to the side indicated by the arrow of a third direction x intersecting the first direction x and the second direction y as shown in the drawings. The terms "under," "lower side," "below," "bottom" and "lower surface" refer to the side opposite to the side indicated by the arrow of the third direction z as shown in the drawings.

Embodiments of the inventive subject matter are described herein with reference to plan and perspective illustrations that are schematic illustrations of idealized embodiments of the inventive subject matter. As such, variations from the shapes of the illustrations as a result, for example, of manufacturing techniques and/or tolerances, are to be expected. Therefore, the embodiments of the invention are not limited to specific features but may include variations depending on the manufacturing processes. Therefore, the regions illustrated in the drawings have schematic attributes, and the shapes of the regions illustrated in the drawings are for illustrating specific shapes and are not for limiting the scope of the invention.

The same or similar elements are herein designated by like reference numerals.

Hereinafter, embodiments of the invention will be described with reference to the accompanying drawings.

FIG. 1 is a perspective view of an embodiment of a display device according to the invention.

FIG. 1 shows a portable terminal as an embodiment of an application employing a display device 1 according to the invention. The portable terminal may include a tablet personal computer ("PC"), a smart phone, a personal digital assistant ("PDA"), a portable multimedia player ("PMP"), a game device, a wristwatch type electronic device, or the like. It is, however, to be understood that the type of the display device 1 is not limited to those listed above. In an embodiment, according to other embodiment of the invention, the display device 1 may be used in a large electronic device such as a television and an electric board, a small and medium electronic device such as a personal computer, a laptop computer, a vehicle navigation device and a camera, for example.

Referring to FIG. 1, the display device 1 may have a quadrangular (e.g., rectangular) shape when viewed from the top. The display device 1 may include two longer sides extended in a first direction x, and two shorter sides extended in a second direction y intersecting the first direction x. Although the corners where the longer sides and the shorter sides of the display device 1 meet may define a right angle, this is merely illustrative. The display device 1 may have rounded corners. Besides, the shape of the display device 1 when viewed from the top is not limited to that shown in the drawings. The display device 1 may have a circular shape or other shapes.

The display device 1 includes a display area DA and a non-display area NDA adjacent to the display area DA. In the display area DA, images are displayed. In the non-display area NDA, no image is displayed. In the display area DA, images are displayed on the upper side or the side indicated by the arrow of the third direction z. In some embodiments, the non-display area NDA may be disposed around the display area DA and may surround the display area DA.

In some embodiments, the display device 1 may be flexible. In an embodiment, the display device 1 may be bent, rolled, or folded, for example.

FIG. 2 is an exploded perspective view of the display device shown in FIG. 1. FIG. 3 is a cross-sectional view of the display device, taken along line X1-X1' of FIGS. 1 and 2. FIG. 4 is an enlarged view of portion Q of FIG. 3.

Referring to FIGS. 2 to 4, the display device 1 includes a display panel structure DP, a digitizer 700 disposed below the display panel structure DP. In addition, the display device 1 may further include an intermediate coupling layer 61 disposed between the digitizer 700 and the display panel structure DP. In addition, the display device 1 may further include a window 100 disposed above the display panel structure DP, a functional layer 200 disposed between the window 100 and the display panel structure DP, a first coupling layer 51 disposed between the functional layer 200 and the window 100, and a second coupling layer 52 disposed between the functional layer 200 and the display panel structure DP.

The window 100 may be disposed on the upper side of the display panel DP to protect the display panel DP. The window 100 may be disposed to overlap the display panel structure DP and cover the entire surface of the display panel structure DP. In some embodiments, the window 100 may be larger than the display panel structure DP. In an embodiment, the window 100 may protrude outward from the shorter sides of the display panel DP, for example. The window 100 may protrude from a display panel 500 also at the longer sides of the display device 1. The window 100 may protrude more at the shorter sides than at the longer sides.

The window 100 may include glass, plastic, etc. In some embodiments, the window 100 may be flexible. When the window 100 includes a glass material, the window 100 may be implemented as an ultra-thin glass to have flexibility. The window 100 including ultra-thin glass may have a thickness of 500 micrometers ($\mu m$) or less along the z direction, and may have a thickness of 25 $\mu m$ to 125 $\mu m$ in some embodiments. It is, however, to be understood that the invention is not limited thereto. The window 100 may include polymers such as polyimide resin, acrylic resin, methacrylic resin, polyisoprene resin, vinyl resin, epoxy resin, urethane resin, cellulose resin and perylene resin.

The functional layer 200 may be disposed between the window 100 and the display panel structure DP.

In some embodiments, when the window 100 includes a glass material, the functional layer 200 may be a shatterproof film. As the functional layer 200, which is the shatterproof film, is combined under the window 100, even when the window 100 is damaged, it is possible to prevent fragments of the window 100 from scattering.

It should be understood that the invention is not limited thereto. The functional layer 200 may also have a function of reducing reflectance of external light incident from the upper side of the window 100, i.e., it may be an anti-reflection layer. In an embodiment, the functional layer 200 may include a retarder and a polarizer, for example. The retarder may be implemented as a film or a substrate coated with liquid crystal, and may include a $\lambda/2$ retarder and/or a $\lambda/4$ retarder. The polarizer may also be implemented as a film or a substrate coated with liquid crystal. The film-type retarder may include a stretchable synthetic resin film, and the liquid-crystal-coated retarder may include liquid crystals arranged in a predetermined pattern.

In an alternative embodiment, the functional layer 200 may include a destructive interference structure. In an embodiment, the destructive interference structure may include a first reflective layer and a second reflective layer disposed on different layers, for example. First reflected light and second reflected light reflected by the first reflective layer and the second reflective layer, respectively, may destructively interfere with each other, and thus reflectance of external light may be reduced.

In some embodiments, the window 100 and the functional layer 200 may be coupled by the first coupling layer 51, and the functional layer 200 and the display panel structure DP may be coupled by the second coupling layer 52. In some embodiments, the first coupling layer 51 and the second coupling layer 52 may be optically transparent. In an embodiment, the first coupling layer 51 and the second coupling layer 52 may be an optically clear adhesive ("OCA") or an optically clear resin ("OCR"), for example.

As shown in FIG. 4, the display panel structure DP may include the display panel 500 and may further include a touch sensor 300.

In some embodiments, the display panel 500 may include a self-luminous element. In an embodiment, the self-luminous element may include at least one of an organic light-emitting diode, a quantum dot light-emitting diode, an inorganic-based micro light-emitting element (e.g., micro light-emitting diode), and an inorganic-based nano light-emitting element (e.g., nano light-emitting diode). In the following description, an example where the self-luminous element is an organic light-emitting diode will be described for convenience of illustration.

The display panel 500 may include a base substrate 510, a first electrode 520, a pixel-defining layer 530, an emission layer 540, a second electrode 550, and an encapsulation layer 570.

The base substrate 510 may be disposed on the intermediate coupling layer 61. The base substrate 510 may be an insulating substrate. The base substrate 510 may be flexible and may include a polymer material having flexibility. The polymer material may be polyimide ("PI"), polyethersulphone ("PES"), polyacrylate ("PA"), polyacrylate ("PAR"), polyetherimide ("PEI"), polyethylenenapthalate ("PEN"), polyethyleneterepthalate ("PET"), polyphenylenesulfide ("PPS"), polyallylate, polycarbonate, cellulosetriacetate ("CAT"), cellulose acetate propionate ("CAP"), or combinations thereof.

The first electrode 520 may be disposed on the base substrate 510. In some embodiments, the first electrode 520 may be an anode electrode.

Although not shown in the drawings, a plurality of elements may be further disposed between the base substrate 510 and the first electrode 520. In an embodiment, the elements may include a buffer layer, a plurality of conductive wirings, an insulating layer, a plurality of thin-film transistors, etc., for example.

The pixel-defining layer 530 may be disposed on the first electrode 520. Openings each exposing at least a portion of the respective first electrodes 520 are defined in the pixel-defining layer 530.

The emission layer 540 may be disposed on the first electrode 520.

In some embodiments, the emission layer 540 may emit one of red light, green light, and blue light. The wavelength of the red light may range from approximately 620 nanometers (nm) to approximately 750 nm, and the wavelength of the green light may range from approximately 495 nm to approximately 570 nm. Further, the wavelength of the blue light may range from approximately 450 nm to approximately 495 nm. The emission layer 540 may consist of a single layer. In an alternative embodiment, the emission layer 540 may have a structure in which multiple organic emission layers are stacked on one another, e.g., a tandem structure.

In an alternative embodiment of the invention, the emission layer 540 may emit white light. When the emission layer 540 emits white light, the emission layer 540 may have a stack structure of a red organic emission layer, a green organic emission layer and a blue organic emission layer.

The second electrode 550 may be disposed on the emission layer 540 and the pixel-defining layer 530. In an embodiment, the second electrode 550 may be disposed entirely on the emission layer 540 and the pixel-defining layer 530, for example. In some embodiments, the second electrode 550 may be a cathode electrode.

The first electrode 520, the second electrode 550 and the emission layer 540 may form a self-luminous element EL.

The encapsulation layer 570 may be disposed on the self-luminous element EL. The encapsulation layer 570 may seal the self-luminous element EL and prevent moisture or the like from permeating into the self-luminous element EL from the outside.

In some embodiments, the encapsulation layer 570 may be implemented as a thin-film encapsulation layer and may include one or more organic layers and one or more inorganic layers. In an embodiment, the encapsulation layer 570 may include a first inorganic layer 571 disposed on the second electrode 550, an organic layer 572 disposed on the first inorganic layer 571, and a second inorganic layer 573 disposed on the organic layer 572, for example.

The first inorganic layer 571 may prevent moisture, oxygen or the like from permeating into the self-luminous element EL. The first inorganic layer 571 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), etc.

The organic layer 572 may be disposed on the first inorganic layer 571. The organic layer 572 may improve the flatness. The organic layer 572 may include a liquid organic material and may include an acrylic resin, a methacrylic resin, polyisoprene, a vinyl resin, an epoxy resin, a urethane resin, a cellulose resin, a perylene resin, etc. Such organic material may be provided on the base substrate 510 through deposition, printing and coating and may be subjected to a curing process.

The second inorganic layer 573 may be disposed on the organic layer 572. The second inorganic layer 573 may perform substantially the same or similar function with the first inorganic layer 571 and may include a material substantially the same as or similar to the first inorganic layer 571. The second inorganic layer 573 may cover an entirety of the organic layer 572. In some embodiment, the second inorganic layer 573 and the first inorganic layer 571 may come in contact with each other in the non-display area NDA to form an inorganic-inorganic junction.

However, the structure of the encapsulation layer 570 is not limited thereto but may vary depending on implementations. In an alternative embodiment, the encapsulation layer 570 may include a glass substrate or the like.

The touch sensor 300 may be disposed on the encapsulation layer 570. In some embodiment, the touch sensor 300 may be disposed directly on the encapsulation layer 570. That is to say, the encapsulation layer 570 may work as a base of the touch sensor 300.

The touch sensor 300 may include a touch element layer 310 and a protective layer 330. The touch element layer 310 may include touch electrodes and touch signal lines connected to the touch electrodes, etc. In some embodiment, the touch electrode may include metal and may have a mesh shape. That is to say, the touch electrode may be formed or provided as a metal mesh pattern, and thus the flexibility of the touch element layer 310 may be improved.

The protective layer 330 may be disposed on the touch element layer 310 and may protect the touch element layer 310. In some embodiment, the protective layer 330 may include an organic material, and may include, for example, an acrylic polymer. When the protective layer 330 includes an organic material, the flexibility of the touch sensor 300 may be improved.

The digitizer 700 may be disposed under the display panel structure DP. In some embodiment, the digitizer 700 may sense the proximity or contact of an electronic instrument (e.g., pen), for example, a stylus that supports electromagnetic resonance ("EMR"). In an embodiment of the invention, the digitizer 700 may include a conductive circuit pattern capable of sensing an external electromagnetic force. In an embodiment, the digitizer 700 may sense an electromagnetic force emitted from the stylus based on the conductive circuit pattern, and may determine a point where the sensed electromagnetic force is greatest as touch coordinates, for example. In addition, since the digitizer 700 may distinguish the proximity or contact by the stylus from a part of the user's body, the digitizer 700 may support a palm rejection capability that ignores the proximity or contact by a part of the body.

In some embodiment, the digitizer 700 may include a base layer 710, a first circuit pattern 730, and a second circuit pattern 750, and may further include a first insulating layer 770 and a second insulating layer 790.

The base layer 710 may have flexibility and may include an insulating material. In an embodiment, the base layer 710 may include an insulating material such as polyimide, for example.

The circuit patterns may be disposed on the both sides of the base layer 710. In an embodiment, the first circuit pattern 730 extended in the first direction x may be disposed on one surface (or upper surface) of the base layer 710 that faces the display panel structure DP or the display panel 500, for example. The second circuit pattern 750 extended in the second direction y may be disposed on the opposite surface (or the lower surface) of the base layer 710 that is opposite to the one surface of the base layer 710.

In some embodiment, the first circuit pattern 730 may include lines regularly spaced apart from one another in the second direction y, and the second circuit pattern 750 may include lines regularly spaced apart from one another in the first direction x. The first circuit pattern 730 and the second circuit pattern 750 may form a lattice structure when viewed from the top.

Although not shown in the drawings, at least two of the lines of the first circuit pattern 730 which are disposed at the opposite ends may be electrically connected to each other to form a loop. Likewise, at least two of the lines of the second circuit pattern 750 which are disposed at the opposite ends may be electrically connected to each other to form a loop.

In some embodiment, the first circuit pattern 730 and the second circuit pattern 750 may include metal material such as copper, silver, nickel and tungsten.

Although each of the first circuit pattern 730 and the second circuit pattern 750 are shown in a stripe shape in the drawings, this is merely illustrative. The shape of each of the first circuit pattern 730 and the second circuit pattern 750 may be modified into a shape in which diamonds are repeatedly arranged or a honeycomb shape in which hexagons are repeatedly arranged.

The first insulating layer 770 covering the first circuit pattern 730 may be disposed on one surface of the base layer 710 that faces the display panel structure DP or the display panel 500. The first insulating layer 770 may provide a flat surface over the first circuit pattern 730 and protect the first circuit pattern 730. In addition, when the digitizer 700 is bent or folded, the first insulating layer 770 may reduce a stress applied to the first circuit pattern 730 by adjusting the location of the neutral plane.

In some embodiment, the first insulating layer 770 may include an organic material. In an embodiment, the first insulating layer 770 may include, but is not limited to, an acrylic resin, a polyimide resin, etc., for example. As the first insulating layer 770 includes an organic material, the first insulating layer 770 may have flexibility, and accordingly the flexibility of the digitizer 700 may be improved.

In some embodiment, the first insulating layer 770 may be a light-absorbing layer, and may include a light-absorbing material such as a black dye and a black pigment. That is to say, the first insulating layer 770 may block transmission of light. As the first circuit pattern 730 and the second circuit pattern 750 include a material such as metal and have a high reflectance, they may reflect light incident from the upper side efficiently. When the reflected light exits out of the display device 1 through the display area, the user may recognize the shapes of the first circuit pattern 730 and the second circuit pattern 750. As a result, the image quality of the display device 1 may be lowered.

The first insulating layer 770 blocks such reflected light from exiting toward the screen. The first insulating layer 770 firstly blocks light from being transmitted to the lower side, and secondly blocks reflected light from being transmitted to the upper side.

The first insulating layer 770 may have a sufficient thickness in order to prevent the first circuit pattern 730 and the second circuit pattern 750 from being noticed and to provide a flat surface over the base layer 710. When the thickness of the first insulating layer 770 is equal to or greater than 2 micrometers (μm), it exhibits an optical density ("OD") of 3.4 or more, so that it may sufficiently reduce the reflectance of the first circuit pattern 730 and the second circuit pattern 750 toward the screen. As a result, it is possible to prevent the first circuit pattern 730 and the second circuit pattern 750 from being noticed.

As the thickness of the first insulating layer 770 increases, the OD may further increase. However, the thickness of the first insulating layer 770 may be 10 μm or less in view of the efficiency of the coating or printing process, the durability, the thickness of the display device, etc.

The second insulating layer 790 covering the first circuit pattern 730 may be disposed under the base layer 710. The second insulating layer 790 may eliminate or reduce a level difference by the second circuit pattern 750 and may provide a substantially flat surface below the base layer 710. In addition, the second insulating layer 790 may protect the second circuit pattern 750.

In some embodiment, the second insulating layer 790 may include an organic material. As the second insulating layer 790 includes an organic material, the second insulating layer 790 may have flexibility, and accordingly the flexibility of the digitizer 700 may be improved. In addition, when the digitizer 700 is bent or folded, the second insulating layer 790 may reduce a stress applied to the second circuit pattern 750 by adjusting the location of the neutral plane.

In some embodiment, unlike the first insulating layer 770, the second insulating layer 790 may not include a light-absorbing material. It should be understood that the invention is not limited thereto. In other embodiment to be described later, the second insulating layer 790 may include a light-absorbing material like the first insulating layer 770.

FIG. 3 shows optical paths. Referring to FIG. 3, when light L1 is incident down to the first circuit pattern 730 from the display panel structure DP, it reaches the first insulating layer 770 through the intermediate coupling layer 61. The first insulating layer 770 absorbs a portion of the light and transmits the other portion of light downward. The transmitted light is reflected by the first circuit pattern 730 to change a path toward the upper side. The light traveling toward the upper side reaches the first insulating layer 770 again, and the first insulating layer 770 absorbs the reached light at least partially. The portion of the light L2 that is not absorbed may be transmitted upward. A great amount of light is absorbed by the first insulating layer 770, and the amount of light L2 that is reflected and exits finally is much reduced than the amount of light L1 that enters initially.

Similarly, when light L3 is incident downward from the display panel structure DP toward the second circuit pattern 750, a portion of the light is partially absorbed by the first insulating layer 770 while the other portion of the light transmits the first insulating layer 770. The transmitted light is reflected by the second circuit pattern 750, and a portion of the reflected light is absorbed by the first insulating layer 770. Accordingly, the amount of light L4 that is reflected by the second circuit pattern 750 and exits finally decreases.

The intermediate coupling layer 61 may be disposed between the display panel structure DP and the digitizer 700, and the display panel structure DP and the digitizer 700 may be coupled by the intermediate coupling layer 61.

In some embodiment, the intermediate coupling layer 61 may be a pressure sensitive adhesive ("PSA").

In some embodiment, the intermediate coupling layer 61 may have a shear modulus lower than that of the display panel 500 or the display panel structure DP. In an embodiment, the shear modulus of the intermediate coupling layer 61 at −20 degrees Celsius (° C.) may be 80 kilopascals (KPa) or more in view of the fabrication process, and may be 150 KPa or less for flexibility of the display device 1.

In some embodiment, as shown in FIG. 4, the intermediate coupling layer 61 may include an adhesive resin layer 611, and a plurality of voids 613 may be dispersed in the adhesive resin layer 611. The voids 613 may be filled with a vacuum or with a gas such as air and an inert gas. As the voids 613 are defined in the intermediate coupling layer 61, the flexibility of the intermediate coupling layer 61 may be further improved.

In some embodiment, the intermediate coupling layer 61 may be in direct contact with the lower surface of the base substrate 510 of the display panel 500 and the upper surface of the first insulating layer 770.

As the display panel structure DP and the digitizer 700 are combined by the flexible intermediate coupling layer 61, the display device 1 having the digitizing function as well as flexibility may be implemented. In addition, as the digitizer 700 has the light-blocking function, there is an advantage in that it is possible to reduce or prevent the patterns of the digitizer 700 from being noticed from outside the display device 1.

The buffer member 800 is disposed under the digitizer 700. The buffer member 800 absorbs an external shock to prevent damage to the digitizer 700 or the display panel structure DP. The buffer member 800 may be a cushion layer. The buffer member 800 may consist of a single layer or a stack of multiple layers. The buffer member 800 may include a material having elasticity such as polyurethane and a polyethylene resin. In some embodiment, the buffer member 800 may include a foam material similar to a sponge.

A lower coupling layer 63 may be disposed between the digitizer 700 and the buffer member 800, and the digitizer 700 and the buffer member 800 may be coupled to each other by the lower coupling layer 63. In some embodiment, the lower coupling layer 63 may be a pressure sensitive adhesive. In some embodiment, the lower coupling layer 63 may be in direct contact with the second insulating layer 790 and the buffer member 800.

Hereinafter, modifications of the display device 1 will be described with reference to FIGS. 5 to 11. In the following description, the redundant description will be omitted and description will focus on the differences.

FIG. 5 is a cross-sectional view showing a modification of the embodiment shown in FIG. 3.

The embodiment of FIG. 5 is substantially identical to the embodiment of FIG. 3 except that a second insulating layer 790a of a digitizer 700a in a display device 1a further includes a light-absorbing material like a first insulating layer 770. In other words, the second insulating layer 790a may also be a light-absorbing layer.

According to this embodiment, some of lights incident toward a second circuit pattern 750 from a display panel structure DP may be absorbed by the first insulating layer 770 while the others of the lights transmit downward. Some of the transmitted lights pass through the spaces of the second circuit pattern 750 and absorbed by the second insulating layer 790a, and some others of the transmitted lights transmit toward the lower side of the digitizer 700a. The light transmitted to the lower side of the digitizer 700a is reflected by an element disposed under the digitizer 700a, for example, a bracket (not shown), and reaches the second insulating layer 790a again. The second insulating layer 790a absorbs at least some of the reached lights. Some of the lights are not absorbed are absorbed by the first insulating layer 770, and accordingly the amount of the lights exiting out of the display device 1a is greatly reduced.

FIG. 6 is a cross-sectional view of another modification of the embodiment shown in FIG. 3.

A display device 1b in the embodiment of FIG. 6 is substantially identical to the display device in the embodiment of FIG. 3 except that a light-absorbing member 400 is further disposed between a display panel structure DP and a digitizer 700, that the light-absorbing member 400 and the display panel structure DP are coupled by a third coupling layer 53, and that a digitizer 700 and the light-absorbing member 400 are coupled by an intermediate coupling layer 61.

The light-absorbing member 400 may include a light-absorbing material such as a black pigment and a black dye. In some embodiment, the light-absorbing member 400 may be a layer coated with the light-absorbing material on one surface or both surface of a base, i.e., a light-blocking layer.

It should be understood that the invention is not limited thereto. The light-absorbing member 400 may be formed or provided by coating a light-absorbing material directly on the lower surface of the display panel structure DP.

Like the first coupling layer 51 and the second coupling layer 52, the third coupling layer 53 may be an OCA or an OCR. When the light-absorbing member 400 is coated directly on the lower surface of the display panel structure DP, the third coupling layer 53 may be eliminated.

The intermediate coupling layer 61 may be in direct contact with the light-absorbing member 400 and the first insulating layer 770.

As the light-absorbing member 400 is further disposed between the digitizer 700 and the display panel structure DP, the amount of light incident on the digitizer 700 from the display panel structure DP and the amount of light reflected off the digitizer 700 to exit to the outside may be further reduced.

FIG. 7 is a cross-sectional view showing a modification of the embodiment shown in FIG. 6.

The embodiment of FIG. 7 is substantially identical to the embodiment of FIG. 6 except that a second insulating layer 790a of a digitizer 700a in a display device 1c further includes a light-absorbing material like a first insulating layer 770. The second insulating layer 790a is substantially identical to that described above except for the aforementioned difference, and therefore, the redundant descriptions will be omitted.

FIG. 8 is a cross-sectional view showing yet another modification of the embodiment shown in FIG. 3.

The embodiment of FIG. 8 is different from the embodiment of FIG. 3 in that the stack structure of a digitizer 701 of a display device 1d is different.

A first circuit pattern 730 is disposed on a base layer 710 of the digitizer 701, and a first insulating layer 771 is disposed on the first circuit pattern 730. A second circuit pattern 750 is disposed on the first insulating layer 771 and a second insulating layer 791 is disposed on the second circuit pattern 750.

The second insulating layer 791 may include an organic material and may further include a light-absorbing material.

The first insulating layer 771 may include an organic material and may not include a light-absorbing material unlike the second insulating layer 791.

The intermediate coupling layer 61 may be in direct contact with the lower surface of the display panel 500 or the display panel structure DP and may be in direct contact with the upper surface of the second insulating layer 790.

In addition, the lower coupling layer 63 may be in direct contact with the base layer 710 and the buffer member 800.

The other elements are substantially identical to those described above in FIG. 3, and therefore, the redundant descriptions will be omitted According to this embodiment, as the second insulating layer 791 works as the light-absorbing layer, it is possible to prevent or suppress the first circuit pattern 730 and the second circuit pattern 750 from being noticed from the outside.

FIG. 9 is a cross-sectional view showing a modification of the embodiment shown in FIG. 8.

The embodiment of FIG. 9 is substantially identical to the embodiment of FIG. 8 except that a first insulating layer 771a of a digitizer 701a in a display device 1e further includes a light-absorbing material.

According to this embodiment, as both the first insulating layer 771a and the second insulating layer 791 work as the light-absorbing layers, it is possible to further prevent the patterns of the digitizer 701a from being noticed due to reflected light.

FIG. 10 is a cross-sectional view of another modification of the embodiment shown in FIG. 8.

A display device if in the embodiment of FIG. 10 is substantially identical to the display device in the embodiment of FIG. 8 except that a light-absorbing member 400 is further disposed between a display panel structure DP and a digitizer 701, that the light-absorbing member 400 and the display panel structure DP are coupled by a third coupling layer 53, and that a digitizer 701 and the light-absorbing member 400 are coupled by an intermediate coupling layer 61. The light-absorbing member 400 and the third coupling layer 53 are substantially identical to those described above with respect to FIG. 6.

FIG. 11 is a cross-sectional view of a modification of the embodiment shown in FIG. 10.

The embodiment of FIG. 11 is substantially identical to the embodiment of FIG. 10 except that a first insulating layer 771a of a digitizer 701a in a display device 1g further includes a light-absorbing material like a second insulating layer 790. The first insulating layer 771a is substantially identical to that described above except for the aforementioned difference, and therefore, the redundant descriptions will be omitted.

FIG. 12 is a perspective view showing an embodiment of a display device in a normal state. FIG. 13 is a perspective view showing an embodiment of the display device in an out-folding state. FIG. 14 is a cross-sectional view of the display device, taken along line X3-X3' of FIG. 13. FIG. 15 is a perspective view showing an embodiment of the display device in an out-folding state, with a part of the display device sliding.

Referring to FIGS. 12 to 15, as shown in FIG. 12, the display device 1 may include several areas defined depending on how they act. In some embodiment, the display device 1 may include a bendable area BA that may be bent on the basis of a bending axis BX, and first and second non-bending areas NBA1 and NBA2 that are not bent. In the normal state where the display device 1 is not bent, the entire display area DA may face the upper side. As used herein, the state where the display device 1 is folded such that the rear surface of the first non-bending area NBA1 and the rear surface of the second non-bending area NBA2 face each other is referred to as the out-folding state, while the state in which the display device 1 is not bent is referred to as the normal state.

As shown in FIGS. 13 and 14, the display device 1 may be outer-bent so that the display area DA is exposed to the outside. As used herein, the state where the display device 1 is bent such that the rear surface of the first non-bending area NBA1 and the rear surface of the second non-bending area NBA2 face each other is referred to as the out-folding state.

The display device 1 may be outer-bent with a predetermined radius of curvature BR by a user's manipulation. The radius of curvature BR may be constant, and the first non-bending area NBA1 and the second non-bending area NBA2 may face each other in parallel. The size of the bendable area BA may be determined depending on the radius of curvature BR. When the display device 1 is in the out-folding state, a portion of the rear surface of the digitizer 700 in the first non-bending area NBA1 and a portion of the rear surface of the digitizer 700 in the second non-bending area NBA2 may overlap each other. In addition, a portion of the rear surface of the buffer member 800 in the first non-bending area NBA1 and a portion of the rear surface of the buffer member 800 in the second non-bending area NBA2 may face each other. The other elements of the display device 1, such as the window 100, the first coupling layer 51, the second coupling layer 52, the functional layer 200, the display panel structure DP and the intermediate coupling layer 61 are identical to those described above, and therefore, the redundant descriptions will be omitted.

In some embodiment, as shown in FIG. 15, a part of the display device 1 may slide along the first direction x in the out-folding state with a predetermined radius of curvature. When a part of the display device 1 slides, a portion of the rear surface of the first non-bending area NBA1 may be not be covered by the second non-bending area NBA2 but may be exposed on the upper side. In addition, while the part of the display device 1 slides, a portion of the bendable area BA may overlap with the second non-bending area NBA2.

In some embodiment, a camera or the like may be disposed on the first non-bending area NBA1 exposed on the upper side when a part of the display device 1 slides in the out-folding state.

FIG. 16 is a perspective view showing the display device in the embodiment of the invention in an in-folding state. FIG. 17 is a cross-sectional view of the display device, taken along line X5-X5' of FIG. 16. FIG. 18 is a perspective view showing the display device in the embodiment of the invention when a part of the display device slides in the in-folding state.

Referring to FIGS. 16 to 18, a display device 1 may be inner-bent such that the display area DA of the first non-bending area NBA1 and the display area DA of the second non-bending area NBA2 face each other. As used herein, the state where the display device 1 is bent such that the display area DA of the first non-bending area NBA1 and the display area DA of the second non-bending area NBA2 face each other is referred to as the in-folding state.

When the display device 1 is in the in-folding state, a portion of the upper surface of the window 100 in the first non-bending area NBA1 and a portion of the upper surface of the window 100 in the second non-bending area NBA2 may face each other. The other elements of the display device 1, such as the digitizer 700, the first coupling layer 51, the second coupling layer 52, the functional layer 200, the display panel structure DP and the intermediate coupling layer 61 are identical to those described above, and therefore, the redundant descriptions will be omitted.

In some embodiment, as shown in FIG. 18, a part of the display device 1 may slide along the first direction x in the in-folding state with a predetermined radius of curvature. When a part of the display device 1 slides, a portion of the display area DA in the second non-bending area NBA2 may be not be covered by the first non-bending area NBA1 but may be exposed on the upper side. In addition, while the part of the display device 1 slides, a portion of the bendable area BA may overlap with the first non-bending area NBA1.

In some embodiment, a sensor such as a fingerprint sensor may be disposed on the display area DA exposed on the upper side when a part of the display device 1 slides in the in-folding state.

Although the digitizer 700 shown in FIGS. 2 and 3 is employed in the embodiment shown in FIGS. 12 to 18, it is to be noted that this is merely illustrative. The digitizers shown in FIGS. 4 to 11 may also be employed by the display devices shown in FIGS. 12 to 18.

The display devices according to the above-described embodiment may include the digitizer without compromising flexibility. In addition, since it is possible to prevent or suppress the patterns of the digitizer from being noticed from the outside, it is possible to prevent or reduce the deterioration of display quality.

Although the embodiments of the invention have been disclosed for illustrative purposes, those skilled in the art would appreciate that various modifications and substitutions may be made without departing from the scope and spirit of the disclosure. Elements of the embodiment of the invention may be modified, for example. Such modifications and substitutions are also construed as falling within the scope of the invention as defined by the appended claims.

What is claimed is:

1. A display device comprising:
a display panel;
a digitizer disposed on the display panel and comprising:
a base layer disposed on the display panel and having flexibility;
a first circuit pattern disposed on a first surface of the base layer which faces the display panel and extended in a first direction;
a second circuit pattern disposed on a second surface of the base layer opposite to the first surface of the base layer and extended in a second direction crossing the first direction; and
a first insulating layer disposed over the first surface of the base layer and covering the first circuit pattern and including a light-absorbing material; and
a first coupling layer disposed between the display panel and the digitizer,
wherein a shear modulus of the first coupling layer ranges from 80 kilopascals (KPa) to 150 kilopascals (KPa) at −20 degrees Celsius (° C.).

2. The display device of claim 1, wherein the first coupling layer is in direct contact with the display panel and the first insulating layer.

3. The display device of claim 1, wherein the first coupling layer comprises an adhesive resin layer and voids dispersed in the adhesive resin layer.

4. The display device of claim 1,
wherein the first coupling layer is a pressure sensitive adhesive.

5. The display device of claim 1, wherein the digitizer further comprises a second insulating layer which is disposed on the second surface of the base layer, covers the second circuit pattern, and comprises an organic material.

6. The display device of claim 5, wherein the second insulating layer is a light-absorbing layer.

7. The display device of claim 1, further comprising:
a light-absorbing member disposed between the display panel and the first coupling layer,
wherein the first coupling layer is in direct contact with the light-absorbing member and the first insulating layer.

8. The display device of claim 1, further comprising:
a touch sensor disposed on the display panel,
wherein the display panel comprises:
a base substrate, a self-luminous element disposed on the base substrate, and an encapsulation layer disposed on the self-luminous element, and
wherein the touch sensor comprises a touch element layer disposed on the encapsulation layer, and a protective layer disposed on the touch element layer and including an organic material.

9. The display device of claim 1, further comprising:
a buffer member disposed on the digitizer and coupled to the digitizer.

10. The display device of claim 9, further comprising:
a second coupling layer disposed between the digitizer and the buffer member,
wherein the digitizer further comprises a second insulating layer which is disposed on the second surface of the base layer, covers the second circuit pattern and comprises an organic material, and
wherein the second coupling layer is in direct contact with the buffer member and the second insulating layer.

11. A display device comprising:
a display panel;
a digitizer disposed on the display panel and comprising:
a base layer disposed on the display panel and having flexibility;
a first circuit pattern disposed on a first surface of the base layer which faces the display panel and extended in a first direction;
a first insulating layer disposed on the first circuit pattern and covering the first circuit pattern;
a second circuit pattern disposed on the first insulating layer and extended in a second direction crossing the first direction; and
a second insulating layer disposed on the second circuit pattern and including a light-absorbing material; and
a first coupling layer disposed between the display panel and the digitizer,
wherein a shear modulus of the first coupling layer ranges from 80 kilopascals (KPa) to 150 kilopascals (KPa) at −20 degrees Celsius (° C.).

12. The display device of claim 11, wherein the first coupling layer is in direct contact with the display panel and the second insulating layer.

13. The display device of claim 11, wherein each of the first insulating layer and the second insulating layer comprises an organic material.

14. The display device of claim 13, wherein the first insulating layer is a light-absorbing layer.

15. The display device of claim 11, further comprising:
a light-absorbing member disposed between the display panel and the first coupling layer,
wherein the first coupling layer is in direct contact with the light-absorbing member and the second insulating layer.

16. The display device of claim 11, further comprising:
a buffer member disposed on the digitizer and coupled to the digitizer; and
a second coupling layer disposed between the buffer member and the digitizer,
wherein the second coupling layer is in direct contact with the base layer and the buffer member.

17. A display device comprising:
a window;
a functional layer disposed on the window and coupled to the window;
a display panel structure disposed on the functional layer and coupled to the functional layer;
a digitizer disposed on the display panel structure and comprising:
a plurality of circuit patterns disposed on the display panel structure, and
an insulating layer disposed between the plurality of circuit patterns and the display panel structure and having flexibility including a light-absorbing material, and
a buffer member disposed on the digitizer and coupled to the digitizer,
wherein the display device further comprises a first coupling layer disposed between the display panel structure and the digitizer, and
wherein a shear modulus of the first coupling layer ranges from 80 kilopascals (KPa) to 150 kilopascals (KPa) at −20 degrees Celsius (° C.).

18. The display device of claim 17, wherein the display panel structure comprises
a display panel comprising a self-luminous element and having flexibility, and a touch sensor disposed on the display panel and having flexibility.

19. The display device of claim 17,
wherein
the first coupling layer is a pressure sensitive adhesive.

20. The display device of claim 17, further comprising:
a light-absorbing member disposed between the display panel structure and the digitizer,
wherein the light-absorbing member is coupled to the display panel structure, and wherein the digitizer is coupled to the light-absorbing member.

* * * * *